United States Patent
Jurgensen et al.

(10) Patent No.: US 7,524,532 B2
(45) Date of Patent: Apr. 28, 2009

(54) PROCESS FOR DEPOSITING THIN LAYERS ON A SUBSTRATE IN A PROCESS CHAMBER OF ADJUSTABLE HEIGHT

(75) Inventors: Holger Jurgensen, Aachen (DE); Gerhard Karl Strauch, Aachen (DE)

(73) Assignee: Aixtron AG (DE)

( * ) Notice: Subject to any disclaimer, the term of this patent is extended or adjusted under 35 U.S.C. 154(b) by 869 days.

(21) Appl. No.: 10/967,776

(22) Filed: Oct. 18, 2004

(65) Prior Publication Data
US 2005/0106319 A1     May 19, 2005

Related U.S. Application Data

(63) Continuation of application No. PCT/EP03/03953, filed on Apr. 16, 2003.

(30) Foreign Application Priority Data
Apr. 22, 2002   (DE) .................. 102 17 806

(51) Int. Cl.
*C23C 16/00* (2006.01)
(52) U.S. Cl. .................. 427/248.1; 118/715; 118/725; 118/500
(58) Field of Classification Search ............. 427/248.1; 118/715, 725, 500
See application file for complete search history.

(56) References Cited

U.S. PATENT DOCUMENTS

| | | | |
|---|---|---|---|
| 5,422,139 A | 6/1995 | Fischer | 427/248.1 |
| 5,595,606 A | 1/1997 | Fujikawa et al. | 118/725 |
| 5,709,757 A | 1/1998 | Hatano et al. | 134/22.14 |
| 5,749,974 A * | 5/1998 | Habuka et al. | 118/725 |

(Continued)

FOREIGN PATENT DOCUMENTS

WO    WO 89/03584    *   4/1989

(Continued)

OTHER PUBLICATIONS

Huh M.-Y., et al., "IGC synthesis of tin nanophase particles Part 1: Study on convection gas currents in IGC chamber." Powder Metallurgy, vol. 45, No. 2, Jul. 2002, pp. 154-159. Abstract Only.*

(Continued)

*Primary Examiner*—Bret Chen
(74) *Attorney, Agent, or Firm*—St. Onge Steward Johnston & Reens LLC

(57) ABSTRACT

A process for depositing thin layers on a substrate in a process chamber arranged in a reactor housing, the bottom of the process chamber consisting of a temperable substrate holder which can be rotatably driven about its vertical axis, and the cover of the chamber consisting of a gas inlet element. The cover extends parallel to the bottom and forms, together with its gas outlets arranged in a sieve-type manner, a gas exit surface which extends over the entire substrate bearing surface of the substrate holder, the process gas being introduced into the process chamber through the gas exit surface. The process includes the step of varying the height of the process chamber, which is defined by the distance between the substrate bearing surface and the gas exit surface, before the beginning of the deposition process and/or during the deposition process.

11 Claims, 3 Drawing Sheets

U.S. PATENT DOCUMENTS

| | | | |
|---|---|---|---|
| 5,781,693 A | | 7/1998 | Ballance et al. ............. 392/416 |
| 5,807,615 A | * | 9/1998 | Sindzingre et al. .......... 427/562 |
| 5,871,586 A | | 2/1999 | Crawley et al. ............. 118/715 |
| 5,997,642 A | * | 12/1999 | Solayappan et al. ........... 118/50 |
| 6,086,677 A | | 7/2000 | Umotoy et al. .............. 118/715 |
| 6,110,290 A | * | 8/2000 | Maeda ....................... 118/725 |
| 6,261,373 B1 | * | 7/2001 | Grant ........................ 118/725 |
| 7,028,698 B2 | * | 4/2006 | Hansen et al. .............. 134/147 |
| 2002/0043216 A1 | * | 4/2002 | Hwang et al. ......... 118/723 VE |
| 2002/0139388 A1 | * | 10/2002 | Chebi et al. .................. 134/1.3 |
| 2006/0100824 A1 | * | 5/2006 | Moriya ....................... 702/183 |

FOREIGN PATENT DOCUMENTS

| | | |
|---|---|---|
| WO | WO 93/17448 | 9/1993 |
| WO | WO 99/42638 | 8/1999 |

OTHER PUBLICATIONS

S.M. Vernon, P.C. Colter, D.D. McNulty, S.J. Hogan, D.W. Weyburne & B.S. Ahern; "Close-Spaced MOCVD Reactor for 1% Uniformity Growth of In-Containing Materials on 4" Substrates"; Rome Laboratories; pp. 137-140.

D.W. Weyburne & B.S. Ahern; "Design and Operating Considerations for a Water-Cooled Close-Spaced Reactant Injector in a Production Scale MOCVD Reactor"; Journal of Crystal Growth 170 (1997) 77-82.

W. Van der Stricht, I. Moerman, P. Demeester, J.A. Crawley & E.J. Thrush; "Study of GaN and InGaN Films Grown by Metalorganic Chemical Vapor Deposition"; Journal of Crystal Growth170 (1997) 344-348.

W.Y. Chung, D.H. Kim & Y.S. Cho; "Modeling of Cu Thin Film Growth by MOCVD Process in a Vertical Reactor"; Journal of Crystal Growth 180 (1998) 691-697.

I. Kim, D.G. Chang & P.D. Dapkus; "Growth of InGaAsP in a Stagnation Flow Vertical Reactor Using TBP and TBA"; Journal of Crystal Growth 195 (1998) 138-143.

T.G. Mihopoulos, S.G. Hummel & K.F. Jensen; "Simulation of Flow and Growth Phenomena in a Close-Spaced Reactor"; Journal of Crystal Growth 195 (1998) 725-732.

* cited by examiner

PROCESS FOR DEPOSITING THIN LAYERS ON A SUBSTRATE IN A PROCESS CHAMBER OF ADJUSTABLE HEIGHT

This application is a continuation of pending International Patent Application No. PCT/EP2003/003953 filed on Apr. 16, 2003 which designates the United States and claims priority of pending German Patent Application No. 102 17 806.2 filed on Apr. 22, 2002.

The invention relates to a process and an apparatus for depositing thin layers on a substrate, having a process chamber which is disposed in a reactor housing and the base of which is formed by a temperature-controllable substrate holder that can be driven in rotation about its vertical axis and the cover of which is formed by a gas outlet member, the cover extending parallel to the base and, by means of its gas outlet openings which are disposed in the manner of a sieve, forming a gas inlet surface which extends over the entire substrate support surface of the substrate holder.

An apparatus of this type, and a process which can be carried out on such an apparatus, are described, inter alia, in U.S. Pat. No. 5,871,586. This apparatus has a reactor housing. Inside the reactor housing there is a substrate holder which is driven in rotation. This substrate holder is located in the horizontal plane and can rotate about its central, vertically positioned axis. A gas inlet member is located at a spacing above the substrate holder which is considerably less than the diameter of the substrate holder. A large number of gas outlet openings, which are disposed in the manner of a sieve, are provided on that side of the gas inlet member which faces the substrate holder. This surface, which is formed in the manner of a showerhead, forms a gas inlet surface through which the process gas, which is supplied to the gas inlet member by means of a feed line, can flow into the process chamber. The reactive molecules of the process gas arrive at the substrate surface substantially through diffusion. If an MOCVD process is carried out in the apparatus, the metalorganic starting substances or the hydrides may decompose within the vapor phase after they have left the gas inlet surface. To prevent decomposition ahead of the outlet openings of the gas inlet member, the gas inlet surface may be cooled. The substrate holder is heated from below by means of a heating device. This heating device may be an induction coil operated with radiofrequency.

The Journal of Crystal Growth, volume 195 (1998), pages 725-732, describes theoretical considerations based on model calculations as to how the layer properties of the layers deposited on substrates resting on the substrate holder can be improved qualitatively if the process chamber height, i.e. the spacing between the substrate support surface and the gas inlet surface, is reduced. In this article, the optimum results are surmised to be in a range between 16 and 25 mm. However, these suppositions apply only for certain process conditions, such as for example the type of reactive gases, the process chamber pressure and the overall gas flow.

Furthermore, variously configured gas inlet members, inter alia likewise having gas outlet openings disposed in the form of a sieve, are known from U.S. Pat. No. 5,781,693, WO 99/42638 and U.S. Pat. No. 6,086,677, U.S. Pat. No. 5,595,606, U.S. Pat. No. 5,709,757 and U.S. Pat. No. 5,422,139.

The invention is based on the object, working on the basis of the apparatus or process described in the introduction, of taking measures which, by widening the range of process parameters which can be influenced, can improve the layer qualities in terms of homogeneity of the composition and homogeneity of the layer thickness.

The object is achieved by the invention specified in the claims. The process proposed in claim 1 provides for the process chamber height, which is defined by the spacing between the substrate holder support surface and the gas outlet surface, to be adjustable before the deposition process commences and/or during the process.

The apparatus described in claim 2 differs from the prior art by virtue of the fact that the process chamber height is adjustable.

According to the invention, the process can be carried out at process chamber heights of less than 75 mm, 60 mm, 50 mm, 40 mm, 35 mm, 30 mm, 25 mm, 20 mm, 16 mm or less than 11 mm. By actuation of a spacer means associated with the reactor housing, the process chamber height can be varied. This variation in the process chamber height is possible in particular with a closed reactor housing. According to the invention, the variation is also carried out in situ, i.e. during a process sequence. This possibility of varying the process chamber height with the reactor housing closed allows the process chamber height to be changed during a deposition process, for example between two process steps. This allows the process chamber height in each case to be matched to the other process parameters. By way of example, if the process steps used have to be carried out at different overall pressures or at different overall gas flow rates, the process chamber height can be adjusted each time to the value which is optimum for these parameters. Of course, the same also applies to different substrate holder temperatures. By varying the process chamber height, it is possible to optimize the isotherm profile above the substrate holder. In a refinement of the invention, it is provided that the substrate holder be displaceable with respect to the base and/or the side wall of the reactor housing. This is advantageous in particular if the reactor housing is pot-shaped in form. The cylindrical cavity formed as a result can be closed off by a cover to which the gas inlet member is fixedly connected. Then, when the reactor housing is opened, the process chamber is also opened at the same time and can be loaded and unloaded from the top. The spacer means may in this case be associated with the base and/or the side wall of the reactor housing. For example, a variant of the invention proposes that the spacer means be a spindle drive. This spindle drive may be associated with the base of the reactor housing. An externally actuable spindle drive which can adjust the height of the spindle-actuated spindle head may be seated on the base. This spindle head supports the substrate holder or a carrier plate which carries the substrate holder. This carrier plate may also carry a gas outlet ring which surrounds the process chamber in the form of a ring and provides a cavity which collects the process gas flowing out of the process chamber. For this purpose, the gas outlet ring has openings which face toward the center of the process chamber. However, it is advantageous not only if the gas outlet ring is vertically displaced together with the substrate holder, but also if the heating element is vertically displaced together with the substrate holder. In this way, there always results a uniform transmission of heating power to the substrate holder. In a variant of the invention, it is provided that the substrate holder, optionally together with the heating apparatus and/or the gas outlet ring, be supported by springs which are prestressed in the direction of the reactor housing opening, which opening can be closed off by the cover, and the substrate holder is vertically displaced when the cover is being closed by adjustable spacer means associated with the cover. In this case, in particular the wall of the reactor housing may form a stop against which the substrate holder or a carrier plate that can be displaced together with the substrate holder butts. This configuration has the advantage that when the reactor housing cover is open, the substrate holder always adopts the same height level, thereby simplifying loading and unloading of the reactor. For this purpose, it is then possible to use an automated unit which always works at the same substrate holder height, irrespective of the height adjustment of the substrate holder during the process.

BRIEF DESCRIPTION OF DRAWINGS

Exemplary embodiments of the invention are explained below with reference to accompanying drawings, in which.

DETAILED DESCRIPTION OF DRAWINGS

Figure 1:
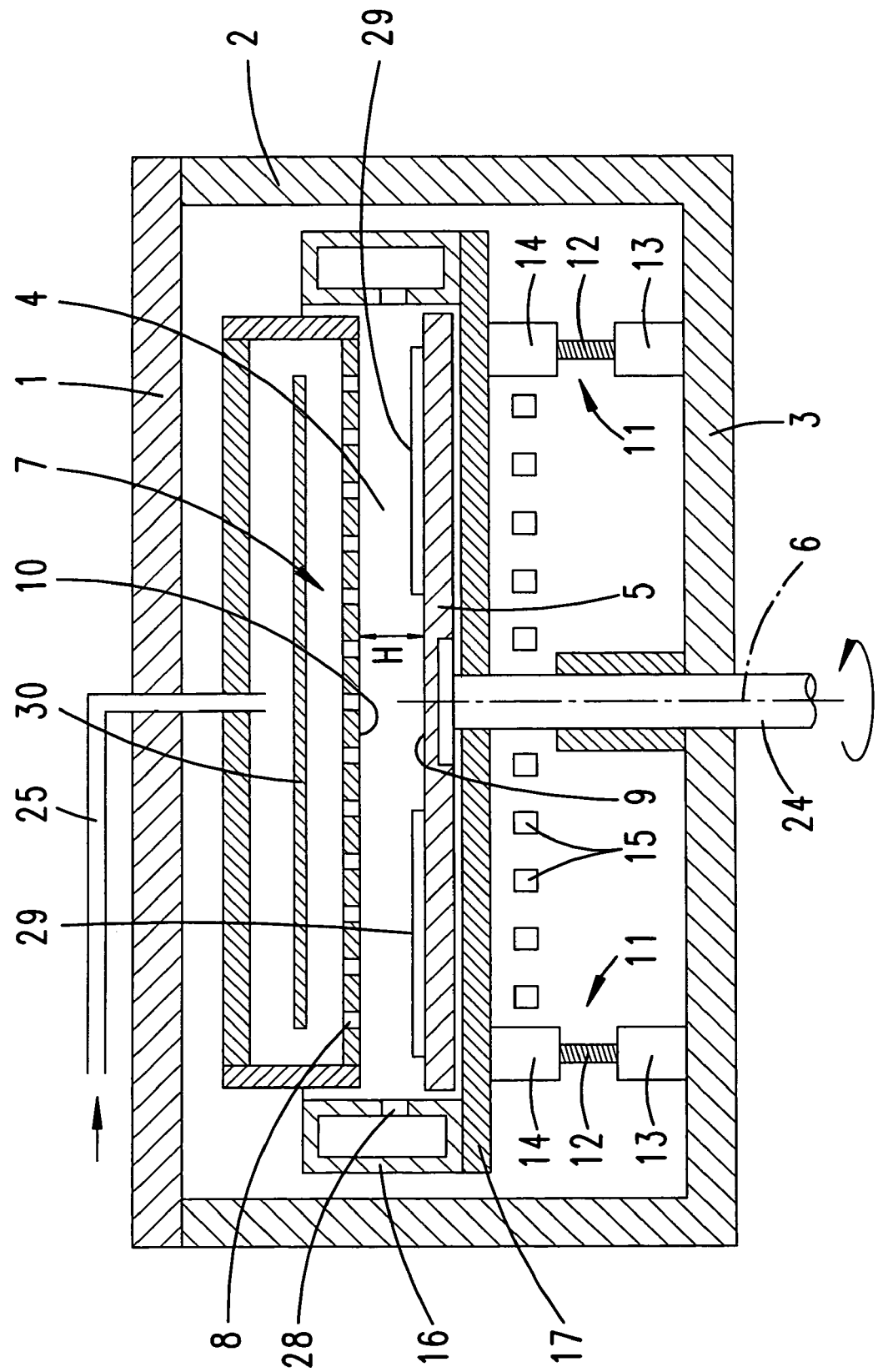
FIG. 1 shows, in highly diagrammatic illustration, a first exemplary embodiment of the invention, in which the spacer means is formed as a spindle drive.

The apparatuses described in the exemplary embodiments have a pot-shaped reactor housing which comprises a side wall 2, surrounding the reactor interior in the shape of a ring, and a horizontal base 3. The reactor housing can be closed by the cover 1. A feed line 25 for the process gases leads through the cover 1. This feed line opens out in a hollow body which is secured to the inner side of the cover 1 and forms a gas inlet member 7. The gas inlet member 7 is fixedly connected to the cover 1 by means which are not illustrated. Inside the cavity of the gas inlet member 7 there is a gas distribution plate 30, so that the process gas flowing out of the feed line 25 can flow in a uniform distribution into the process chamber 4 through the outlet openings 8 which are disposed in the form of a sieve and are associated with the base of the gas inlet member 7. The surface, which is perforated by the outlet openings 8, of the abovementioned base of the gas inlet member 7 forms a gas inlet surface 10 located opposite the substrate support surface 9 at a constant spacing H.

The substrate holder support surface 9 is formed by the surface of a substrate holder 5, made in particular from graphite.

This substrate holder 5 can be driven in rotation by means of a drive shaft which is rotatable about the axis of rotation 6.

Beneath the substrate holder 5 there is a carrier plate, which is denoted by reference numeral 17. This carrier plate 17 need not be solid in form. It may also have spokes in the region of the substrate holder 5. At any rate, it is ensured that the energy released by the heating element 15 heats the substrate holder 5. In a preferred configuration, the heating element 15 is formed by a radiofrequency coil which, inside the substrate holder 5, generates heat by induction of eddy currents in order to heat the substrate holder 5 to process temperature.

The process chamber 4 is surrounded annularly by a gas outlet ring 16. This gas outlet ring 16 has a multiplicity of openings 28 which are approximately at the level of the substrate holder support surface, so that the gas which has entered the process chamber 4 through the outlet openings 8, after suitable vapor-phase reactions or surface reactions on the substrates 29, can be discharged from the process chamber 4. In the exemplary embodiments, this gas outlet ring 16 rests on a carrier plate 17. The heating element 15 is also fixedly connected to the carrier plate 17, with the result that in the event of a vertical displacement of the carrier plate 17, not only the substrate holder 5 and the gas outlet ring 16, but also the heating element 15 are displaced with it.

The exemplary embodiments show, by way of example, a number of spacer means 11 of various forms for varying the height position of the substrate holder 5, in particular of the substrate support surface, i.e. the spacing H between substrate support surface and gas inlet surface 10. In variants which are not illustrated, this spacing may also be effected by axial displacement of the drive shaft for the substrate holder 5 or by drive members configured in other forms, for example by scissor mechanisms.

In the exemplary embodiment illustrated in FIG. 1, a plurality of spindle carriers 13 are seated on the base 3 of the reactor housing. Spindle drive motors which can be driven externally or electrically by means of a motor disposed there are located in these spindle carriers 13. These spindle drive motors can drive a threaded spindle 12, the spindle nut of which is disposed in a spindle bearing 14 located beneath the carrier plate 17. Synchronous rotation of the spindles 12 therefore allows the level of the carrier plate 17 and therefore the spacing H (process chamber height) to be adjusted. The height of the gas outlet ring 16 is such that the gas outlet ring 16 laterally delimits the process chamber in all process chamber heights H which can be set.

Figure 2:
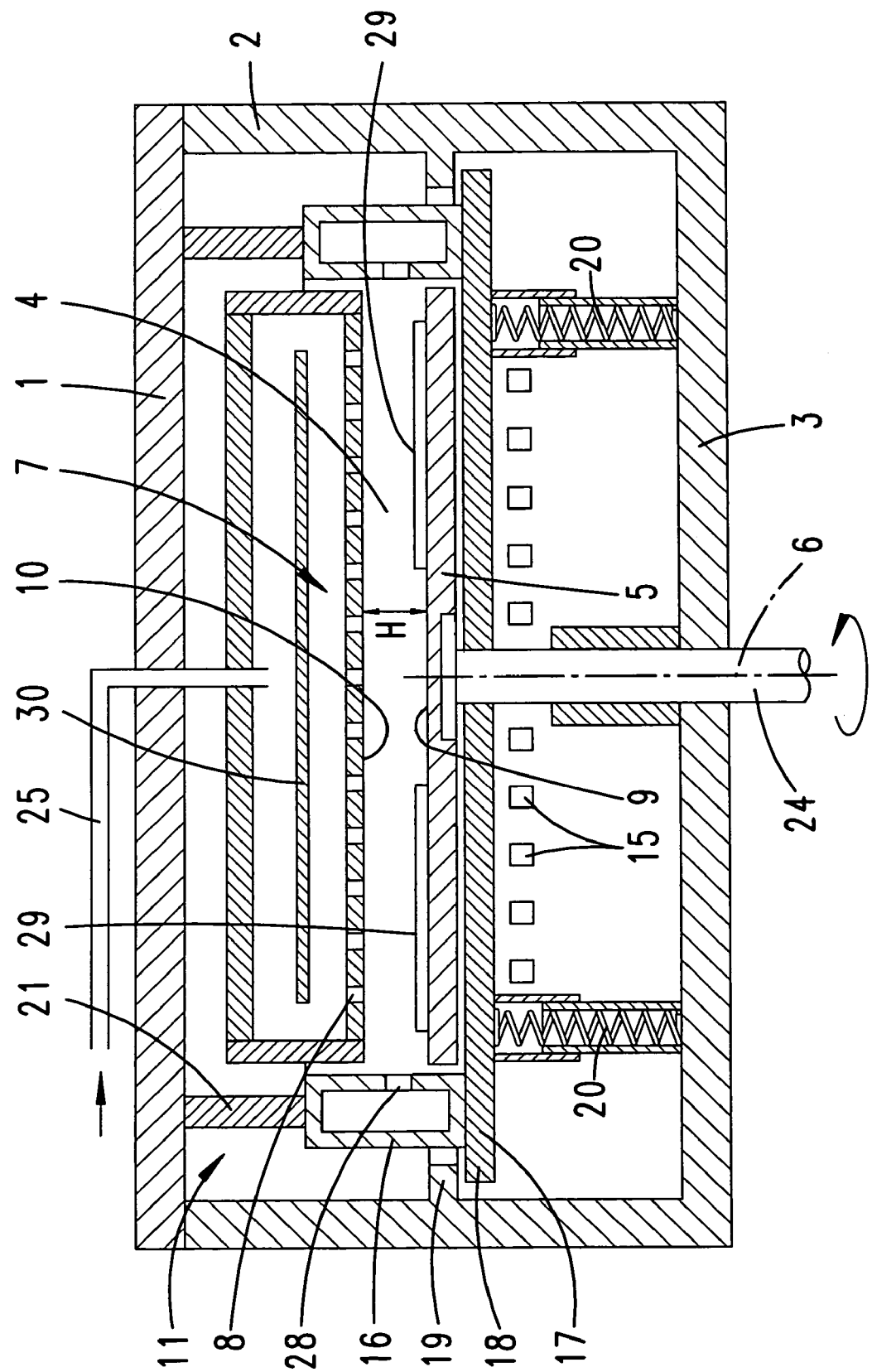
FIG. 2 shows a second, likewise highly diagrammatically illustrated, exemplary embodiment, in which the spacer means is formed as a spacer ring which is fixedly mounted on the cover of the reactor housing.

In the exemplary embodiment illustrated in FIG. 2, the carrier plate 17 or the substrate holder 5 is mounted on springs 20 which are supported on the base 3 of the reactor housing. The springs 20 are prestressed in the direction of the cover 1 of the reactor housing. In the exemplary embodiment, the carrier plate has a stop shoulder 18 which, with the reactor housing cover 1 open, butts against a stop 19 of the reactor housing wall 2. In this position, with the reactor housing cover 1 open, the substrate holder 5 can be loaded with one or more substrates 29 or unloaded.

An exchangeable spacer ring 21 is positioned on that surface of the cover 1 of the reactor housing which faces toward the inside of the housing. The width of the ring 21 may be varied and defines the process chamber height H. For this purpose, the spacer ring 21 is supported on the carrier plate 17 or on the gas outlet ring 16 held by the carrier plate 17 and displaces the substrate holder 5 downward when the cover 1 is being closed, so that the height H is adjusted.

Figure 3:
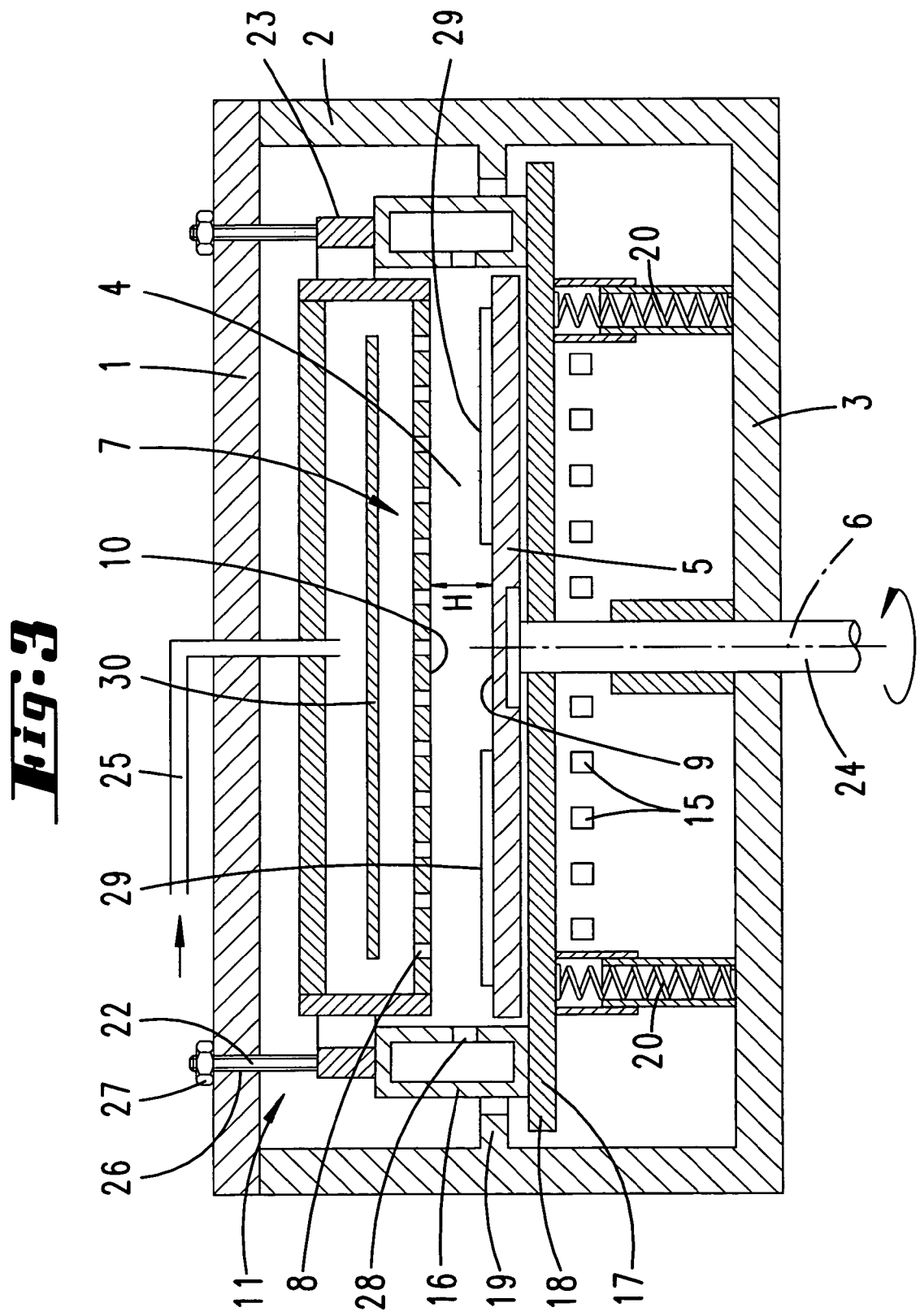
FIG. 3 shows a third exemplary embodiment, likewise in highly diagrammatic illustration, in which the spacer means is likewise associated with the cover of the reactor housing and the spacer means can be adjusted from outside the reactor housing.

In the exemplary embodiment illustrated in FIG. 3, the spacer means 11 are likewise associated with the reactor housing cover 1. In this exemplary embodiment, however, the height of the spacer means 11 can be adjusted. FIG. 3 shows the simplest variant for height adjustability, by virtue of a threaded pin or a threaded spindle 22 pressing on a pressure ring 23, which has a similar function to the spacer ring 21. This threaded pin 22 can be screwed into a threaded bore 26 in the reactor housing cover 1. Turning the threaded pin 22 allows the height position of the pressure ring 23 or the process chamber height H to be adjusted. The rotational position of the threaded rod 22 is fixed by a locking nut 27.

It is possible for a plurality of spacer means 11 of this type to be associated with the reactor housing cover 1. In particular, there is provision for these spacer means 11 to be motor-controlled. It is conceivable for the threaded rods 22 to be provided with spindle drives, so that the process chamber height H can be varied during the process or at least after the reactor housing has been closed.

The diameter of the circular substrate holder 5 may be more than 10 cm, more than 30 cm, more than 35 cm, more than 40 cm or more than 45 cm. The diameter of the substrate holder 5 substantially corresponds to the diameter of the circular gas inlet surface 10. The process chamber height H is significantly smaller than the diameter of the substrate holder 5 and may be less than 75 mm, less than 60 mm, less than 50 mm, less than 40 mm, less than 35 mm, less than 30 mm, less than 25 mm, less than 20 mm, less than 16 mm and even less than 11 mm. The adjustment of the process chamber height H may take place during the coating process and in particular during a purge phase between two process steps. As the process for the deposition of thin layers, an MOCVD process is preferably used, in which the elements belonging to main group III are passed to the gas inlet member 7 through the feed line 25 in the form of metalorganic compounds. The elements belonging to main group V are fed to the gas inlet member 7 through the feed line 25 in the form of hydrides. As a result of cooling of the region of the base plate of the gas inlet member 7 which surrounds the gas outlet openings 8, premature decomposition of these gaseous starting substances is avoided. The process chamber height can be adjusted depending on the process parameters, such as total gas flow rate, total pressure and rotational speed of the substrate holder. The lifting device which is associated with the reactor housing and can be used to displace in particular the gas inlet member 7 or the substrate holder 5 forming the base 3, may be a ferrofluidic lifting device. A helium-tight lifting device of this type is particularly suitable for acting in the Z direction.

All features disclosed are (inherently) pertinent to the invention. The disclosure content of the associated/appended priority documents (copy of the prior application) is hereby incorporated in its entirety in the disclosure of the application, partly with a view to incorporating features of these documents in claims of the present application.

What is claimed is:

1. A process for depositing thin layers on a substrate in a process chamber which is disposed in a reactor housing, the base of said process chamber being formed by a temperature-controllable substrate holder and said process chamber including a cover that is formed by a gas inlet member that extends parallel to the base, said cover including gas outlet openings, which are disposed in the manner of a sieve, to form a gas outlet surface which extends over the entire substrate support surface of the substrate holder, comprising the steps of:
   introducing process gas into the process chamber through the gas outlet surface;
   driving the substrate holder in rotation about its vertical axis; and
   varying the process chamber height, which is defined by the space between the substrate support surface and the gas outlet surface, during the deposition process.

2. The process according to claim 1, wherein the step of varying the process chamber height occurs while the reactor housing is closed.

3. The process according to claim 1, wherein the process chamber height is varied using spacer means, which are associated with the reactor housing that is closed in a gastight manner.

4. The process according to claim 1, wherein the step of varying the process chamber height includes displacing the substrate holder with respect to the base and/or a side wall of the reactor housing.

5. The process according to claim 1, characterized in that the gas inlet member is fixedly connected to a reactor housing cover.

6. The process according to claim 3, wherein the spacer means are associated with the base and/or a side wall of the reactor housing and are formed by a spindle drive or a ferrofluidic lifting drive.

7. The process according to claim 1, further comprising the step of varying the height of a heating device disposed beneath the substrate holder at the same time that the process chamber height is varied.

8. The process according to claim 1, further comprising the step of varying the height of a gas outlet ring, which surrounds the substrate holder and the process chamber in its maximum possible height in such a manner as to close them off in the lateral direction, at the same time that the process chamber height is varied.

9. The process according to claim 1, wherein the substrate holder, optionally together with the heating device and/or the gas outlet ring, is supported by springs which are prestressed in the direction of the reactor housing opening, which opening is closed off by the reactor housing cover, such that during the step of varying the process chamber height, the substrate holder, optionally together with the heating device and/or the gas outlet ring, is vertically displaced when the reactor housing cover is closed by an adjustable spacer means associated with the reactor housing cover.

10. The process according to claim 9, wherein the spacer means associated with the cover is a spacer ring or a pressure ring, and the step of varying the process chamber height includes actuating the spacer means by spindles or threaded rods, which interact with the gas outlet ring and/or a carrier plate which carries the gas outlet ring.

11. The process according to claim 10, wherein a first stop shoulder, associated with the carrier plate or the substrate holder, engages against a stop which is fixed to the housing when the reactor housing cover is open.

* * * * *